(12) United States Patent
Ma et al.

(10) Patent No.: US 11,101,927 B2
(45) Date of Patent: Aug. 24, 2021

(54) DATA TRANSMISSION METHOD, BASE STATION, AND TERMINAL DEVICE

(71) Applicant: Huawei Technologies Co., Ltd., Shenzhen (CN)

(72) Inventors: Liang Ma, Shanghai (CN); Xin Zeng, Shenzhen (CN); Chen Zheng, Shanghai (CN); Yuejun Wei, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 8 days.

(21) Appl. No.: 16/673,613

(22) Filed: Nov. 4, 2019

(65) Prior Publication Data

US 2020/0067641 A1 Feb. 27, 2020

Related U.S. Application Data

(63) Continuation of application No. PCT/CN2018/085408, filed on May 3, 2018.

(30) Foreign Application Priority Data

May 4, 2017 (CN) .......................... 201710307430.1

(51) Int. Cl.
*H04L 1/00* (2006.01)
*H04W 72/04* (2009.01)
(Continued)

(52) U.S. Cl.
CPC ....... *H04L 1/0061* (2013.01); *H03M 13/1102* (2013.01); *H03M 13/255* (2013.01);
(Continued)

(58) Field of Classification Search
CPC ... H04L 1/0061; H04L 1/0003; H04L 1/0058; H04L 1/00; H04L 1/18; H04L 1/1812;
(Continued)

(56) References Cited

U.S. PATENT DOCUMENTS

2008/0037676 A1  2/2008 Kyung et al.
2009/0055705 A1* 2/2009 Gao ...................... H03M 13/29
                                                   714/755
(Continued)

FOREIGN PATENT DOCUMENTS

CN   102684824 A    9/2012
CN   104579576 A    4/2015
WO   2015164251 A1 10/2015

OTHER PUBLICATIONS

"LDPC design for eMBB data," 3GPP TSG RAN WG1 Meeting #88, Athens, Greece, R1-1701706, pp. 1-7, 3rd Generation Partnership Project, Valbonne, France (Feb. 13-17, 2017).
(Continued)

*Primary Examiner* — Thien Nguyen
(74) *Attorney, Agent, or Firm* — Leydig, Voit & Mayer, Ltd.

(57) ABSTRACT

This application provides a data transmission method, a base station, and a terminal device. The method includes: determining, by a base station, a target base graph in N Raptor-like low-density parity-check (LDPC) base graphs; and sending, by the base station, indication information to a terminal device, where the indication information is used to indicate the terminal device to use the target base graph to perform LDPC encoding and decoding. Based on the foregoing technical solution, the base station may determine a target base graph in a plurality of Raptor-like LDPC base graphs that may be used to perform LDPC encoding and decoding, and indicate the target base graph to the terminal device. Further, for one code rate or one code length, the base station may select different base graphs as required.

27 Claims, 3 Drawing Sheets

(51) Int. Cl.
*H03M 13/11* (2006.01)
*H03M 13/25* (2006.01)
*H03M 13/00* (2006.01)

(52) U.S. Cl.
CPC ...... *H03M 13/6525* (2013.01); *H04L 1/0003* (2013.01); *H04L 1/0058* (2013.01); *H04W 72/042* (2013.01)

(58) Field of Classification Search
CPC ........... H03M 13/1102; H03M 13/255; H03M 13/6525; H04W 72/042
See application file for complete search history.

(56) References Cited

U.S. PATENT DOCUMENTS

| | | | | |
|---|---|---|---|---|
| 2010/0100791 A1* | 4/2010 | Abu-Surra | ........... | H03M 13/118 714/752 |
| 2018/0337691 A1* | 11/2018 | Kalachev | ............ | H03M 13/036 |

OTHER PUBLICATIONS

"LDPC design for eMBB data," 3GPP TSG-RAN WG1 Meeting #88, Athens, Greece, R1-1703100, pp. 1-12, 3rd Generation Partnership Project, Valbonne, France (Feb. 13-17, 2017).

"DCI Formats and Contents for NR," 3GPP TSG RAN WG1 #88, Athens, Greece, R1-1702975, 5 pages, 3rd Generation Partnership Project, Valbonne, France (Feb. 13-17, 2017).

"Design of LDPC Codes for NR," 3GPP TSG RAN WG1 Meeting #87, Reno, USA, R1-1611321, Total 11 pages, 3rd Generation Partnership Project, Valbonne, France (Nov. 14-18, 2016).

"Number of LDPC codes in NR," 3GPP TSG RAN WG1 Meeting #88, Athens, Greece, R1-1703210, Total 3 pages, 3rd Generation Partnership Project, Valbonne, France (Feb. 13-17, 2017).

"LDPC Code Design," 3GPP TSG RAN WG1 AH_NR Meeting, Spokane, USA, R1-1700108, Total 11 pages, 3rd Generation Partnership Project, Valbonne, France (Jan. 16-20, 2017).

"On LDPC Coding Chain Design," 3GPP TSG RAN WG1 Meeting #88bis, Spokane, USA, R1-1705526, Total 2 pages, 3rd Generation Partnership Project, Valbonne, France (Apr. 3-7, 2017).

"LDPC Base Graph Determination and Signaling," 3GPP TSG RAN WG1 Meeting 91, Reno, USA, R1-1720642, Total 2 pages, 3rd Generation Partnership Project, Valbonne, France (Nov. 27-Dec. 1, 2017).

* cited by examiner

DATA TRANSMISSION METHOD, BASE STATION, AND TERMINAL DEVICE

CROSS-REFERENCE TO RELATED APPLICATIONS

This application is a continuation of International Application No. PCT/CN2018/085408, filed on May 3, 2018, which claims priority to Chinese Patent Application No. 201710307430.1, filed on May 4, 2017. The disclosures of the aforementioned applications are hereby incorporated by reference in their entireties.

TECHNICAL FIELD

This application relates to the communications field, and more specifically, to a data transmission method, a base station, and a terminal device.

BACKGROUND

In an enhanced mobile Internet (eMBB) scenario of a 5th generation (5G) communications system, a Raptor-like low-density parity-check code (LDPC) is determined to be used for data channel a coding scheme.

A Raptor-like LDPC base graph that may be used in the 5G communications system is used as an example. One Raptor-like LDPC base graph may be used to perform encoding on a to-be-encoded code block with a length ranging from 40 bits to 8192 bits, and achieves a code rate of encoding ranging from $1/5$ to $8/9$. However, there are some problems when such a wide range of code lengths and such a wide range of code rates are supported by using one Raptor-like LDPC base graph. For example, the Raptor-like LDPC base graph fails to ensure encoding performance and decoding performance of code blocks with different lengths, and fails to ensure performance of both high-code-rate encoding and decoding and low-code-rate encoding and decoding.

SUMMARY

This application provides a data transmission method, a base station, and a terminal device, so that an encoded transport block can meet a requirement of an actual service.

According to a first aspect, an embodiment of this application provides a data transmission method. The method includes: determining, by a base station, a target base graph in N Raptor-like low-density parity-check code LDPC base graphs, where a first base graph and a second base graph are any two of the N Raptor-like LDPC base graphs, a quantity of columns corresponding to information bits included in the first base graph is different from a quantity of columns corresponding to information bits included in the second base graph, an intersection between code lengths supported by the first base graph and the second base graph is not empty, an intersection between code rates supported by the first base graph and the second base graph is not empty, and N is a positive integer greater than or equal to 2; and sending, by the base station, indication information to a terminal device, where the indication information is used to indicate the terminal device to use the target base graph to perform LDPC encoding and decoding. Based on the foregoing technical solution, the base station may determine a target base graph in a plurality of Raptor-like LDPC base graphs that may be used to perform LDPC encoding and decoding, and indicate the target base graph to the terminal device. Further, for one code rate or one code block length, the base station may select different base graphs as required.

With reference to the first aspect, in a first possible implementation of the first aspect, the sending, by the base station, indication information to a terminal device includes: determining, by the base station in at least N MCS indexes based on a correspondence between a modulation and coding scheme MCS index and a base graph, a target MCS index corresponding to the target base graph; and sending, by the base station, the target MCS index to the terminal device, where the target MCS index is the indication information. The base station may use an MCS index in existing signaling to carry the indication information. Therefore, in the foregoing technical solution, the determined target base graph may be indicated to the terminal device without increasing signaling overheads and without changing a signaling structure.

With reference to the first possible implementation of the first aspect, in a second possible implementation of the first aspect, the correspondence between an MCS index and a base graph is indicated by using an MCS table, where the MCS table includes the at least N MCS indexes, each of the at least N MCS indexes corresponds to one of the N Raptor-like LDPC base graphs, and each of the at least N MCS indexes further corresponds to at least one of a modulation order and a transport block size index. The target base graph may be correlated with a transport block size. Therefore, both the target base graph and a transport block size index corresponding to the target base graph are indicated to the terminal device by using the MCS index.

With reference to any one of the first aspect or the foregoing possible implementations of the first aspect, in a third possible implementation of the first aspect, the method further includes: determining, by the base station, a target lifting factor group in at least two lifting factor groups based on requirement information, where each of the at least two lifting factor groups includes a plurality of lifting factors, and the requirement information includes at least one of a terminal device type, a throughput rate requirement, a latency requirement, an initial-transmission code rate value, and a service type; determining, by the base station based on a length of a to-be-encoded code block, a target lifting factor in a plurality of lifting factors included in the target lifting factor group; and performing, by the base station, LDPC encoding on the to-be-encoded code block based on the target lifting factor and the target base graph. Different requirements and different hybrid automatic repeat request (HARQ) performance are satisfied by selecting proper lifting factors.

With reference to any one of the first aspect, the first possible implementation of the first aspect, or the second possible implementation of the first aspect, in a fourth possible implementation of the first aspect, the method further includes: determining, by the base station, a target lifting factor group in at least two lifting factor groups based on requirement information, where each of the at least two lifting factor groups includes a plurality of lifting factors, and the requirement information includes at least one of a terminal device type, a throughput rate requirement, a latency requirement, an initial-transmission code rate value, and a service type; determining, by the base station based on a length of a to-be-encoded code block, a target lifting factor in a plurality of lifting factors included in the target lifting factor group; receiving, by the base station, a code block sent by the terminal device, where the code block sent by the terminal device is obtained by the terminal device by performing LDPC encoding on the to-be-encoded code block based on the target lifting factor and the target base graph; and performing, by the base station, LDPC decoding on the received code block based on the target lifting factor and the target base graph. Different requirements and different HARQ performance are satisfied by selecting proper lifting factors.

With reference to any one of the first aspect or the foregoing possible implementations of the first aspect, in a fifth possible implementation of the first aspect, the columns of the second base graph are a subset of the columns of the first base graph. This can reduce storage space for storing Raptor-like LDPC base graphs.

According to a second aspect, an embodiment of this application provides a data transmission method. The method includes: receiving, by a terminal device, indication information sent by a base station; determining, by the terminal device according to the indication information, a target base graph used to perform low-density parity-check code LDPC encoding and decoding, where the target base graph is from N Raptor-like LDPC base graphs, a first base graph and a second base graph are any two of the N Raptor-like LDPC base graphs, a quantity of columns corresponding to information bits included in the first base graph is different from a quantity of columns corresponding to information bits included in the second base graph, an intersection between code lengths supported by the first base graph and the second base graph is not empty, an intersection between code rates supported by the first base graph and the second base graph is not empty, and N is a positive integer greater than or equal to 2.

With reference to the second aspect, in a first possible implementation of the second aspect, the receiving, by a terminal device, indication information sent by a base station includes: receiving, by the terminal device, a target modulation and coding scheme MCS index sent by the base station, where the target MCS index is the indication information; and the determining, by the terminal device according to the indication information, a target base graph used to perform LDPC encoding and decoding includes: determining, by the terminal device based on a correspondence between an MCS index and a base graph, a base graph corresponding to the target MCS index as the target base graph. Therefore, in the foregoing technical solution, the target base graph may be determined without increasing signaling overheads and without changing a signaling structure.

With reference to the first possible implementation of the second aspect, in a second possible implementation of the second aspect, the receiving, by a terminal device, indication information sent by a base station includes: receiving, by the terminal device, the target modulation and coding scheme MCS index sent by the base station, where the target MCS index is the indication information; and the determining, by the terminal device according to the indication information, a target base graph used to perform LDPC encoding and decoding includes: determining, by the terminal device based on the correspondence between an MCS index and a base graph, the base graph corresponding to the target MCS index as the target base graph. Therefore, both the target base graph and a transport block size index corresponding to the target base graph are obtained by using the MCS index.

With reference to any one of the second aspect or the foregoing possible implementations of the second aspect, in a third possible implementation of the second aspect, the method further includes: determining, by the terminal device, a target lifting factor group in at least two lifting factor groups based on requirement information, where each of the at least two lifting factor groups includes a plurality of lifting factors, and the requirement information includes at least one of a terminal device type, a throughput rate requirement, a latency requirement, an initial-transmission code rate value, and a service type; determining, by the terminal device based on a code length of a to-be-encoded code block, a target lifting factor in a plurality of lifting factors included in the target lifting factor group; and performing, by the terminal device, LDPC encoding on the to-be-encoded code block based on the target lifting factor and the target base graph. Different requirements and different HARQ performance are satisfied by selecting proper lifting factors.

With reference to any one of the second aspect, the first possible implementation of the second aspect, or the second possible implementation of the second aspect, in a fourth possible implementation of the second aspect, the method further includes: determining, by the terminal device, a target lifting factor group in at least two lifting factor groups based on requirement information, where each of the at least two lifting factor groups includes a plurality of lifting factors, and the requirement information includes at least one of a terminal device type, a throughput rate requirement, a latency requirement, an initial-transmission code rate value, and a service type; determining, by the terminal device based on a code length of a to-be-encoded code block, a target lifting factor in a plurality of lifting factors included in the target lifting factor group; receiving, by the terminal device, a code block sent by the base station, where the code block sent by the base station is obtained by the base station by performing LDPC encoding on the to-be-encoded code block based on the target lifting factor and the target base graph; and performing, by the terminal station, LDPC decoding on the received code block based on the target lifting factor and the target base graph. Different requirements and different HARQ performance are satisfied by selecting proper lifting factors.

With reference to any one of the second aspect or the foregoing possible implementations of the second aspect, in a fifth possible implementation of the second aspect, the columns of the second base graph are a subset of the columns of the first base graph. This can reduce storage space for storing Raptor-like LDPC base graphs.

According to a third aspect, an embodiment of this application provides a base station. The base station includes units configured to perform the method in the first aspect or any possible implementation of the first aspect.

According to a fourth aspect, an embodiment of this application provides a terminal device. The terminal device includes units configured to perform the method in the second aspect or any possible implementation of the second aspect.

According to a fifth aspect, an embodiment of this application provides a base station. The base station includes a memory, a transceiver, and a processor. The memory stores an instruction used to implement the method in the first aspect or any possible implementation of the first aspect, and the processor executes, in combination with the transceiver, the instruction stored in the memory.

According to a sixth aspect, an embodiment of this application provides a terminal device. The terminal device includes a memory, a transceiver, and a processor. The memory stores an instruction used to implement the method in the second aspect or any possible implementation of the second aspect, and the processor executes, in combination with the transceiver, the instruction stored in the memory.

According to a seventh aspect, an embodiment of this application provides a computer-readable storage medium. The computer-readable storage medium stores an instruction, and when the instruction is run on a computer, the computer is enabled to perform the method in the foregoing aspects.

According to an eighth aspect, an embodiment of this application provides a computer program product including an instruction. When the computer program product is run on a computer, the computer is enabled to perform the method in the foregoing aspects.

DESCRIPTION OF EMBODIMENTS

Figure 1:
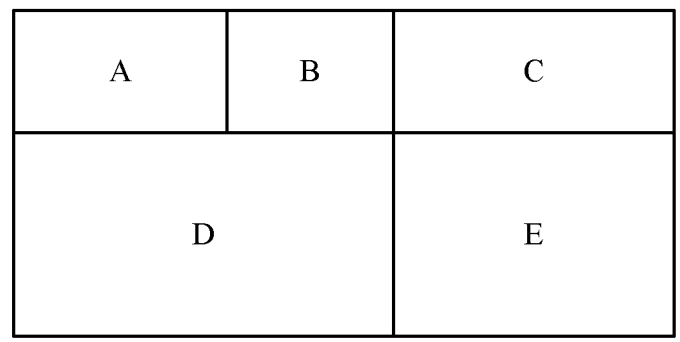
FIG. 1 is a schematic diagram of a Raptor-like LDPC matrix.

The following describes technical solutions of this application with reference to accompanying drawings.

It should be understood that, the technical solutions of the embodiments of this application may be applied to various communications systems in which Raptor-like LDPC matrices are used to perform encoding and decoding, for example, a 5th generation (5G) network system and a new radio (NR) system.

Wireless transmission devices described in the embodiments of this application may include a terminal device and a network device.

A terminal device described in the technical solutions of the embodiments of this application may be referred to as an access terminal, user equipment (UE), a subscriber unit, a subscriber station, a mobile station, a mobile console, a remote station, a remote terminal, a mobile device, a user terminal, a terminal, a wireless communications device, a user agent or a user apparatus, a handheld device with a wireless communication function, a computing device or another processing device connected to a wireless modem, an in-vehicle device, a wearable device, and a terminal device in a future 5G network. The terminal device may communicate with one or more core networks through a radio access network (RAN), or may be connected to a distributed network in a self-organizing manner or a grant-free manner. The terminal device may be alternatively connected to a wireless network in another manner for communication, or the terminal device may directly perform wireless communication with another terminal device. This is not limited in the embodiments of this application.

A network device described in the embodiments of this application may be a nodeB, an evolved nodeB (eNB), a base station in a communications system, a base station or a network device in a future communications system, and the like.

A data link layer sends data by transport blocks (TB) to a physical layer for processing. After receiving a transport block, the physical layer first adds cyclic redundancy check (CRC) parity bits to the transport block, to enhance a capability of performing error detection on the TB. An input length supported by an encoder is limited. In some cases, a length of a TB to which CRC parity bits are added may be greater than an input length supported by the encoder. In the cases, code block segmentation needs to be performed on the TB to which the CRC parity bits are added. Code block segmentation is to segment a transport block with CRC parity bits into a plurality of code blocks (CB) whose lengths match an input length supported by the encoder, for encoding by the encoder. In some cases, a length of a TB with CRC parity bits may be smaller than a length supported by the encoder, and in this case, filler bits may be inserted into the TB to reach a length matching the input length supported by the coder.

A to-be-encoded code block described in the embodiments of this application is a code block that is input into a encoder. For example, in an encoding process, CRC parity bits may be attached to a CB obtained through code block segmentation, and the CB with the CRC parity bits is input into the encoder. In the embodiments, a CB with CRC parity bits is a to-be-encoded code block or a to-be-LDPC encoded code block described in the embodiments of this application.

FIG. 1 is a schematic diagram of a Raptor-like LDPC matrix. The Raptor-like LDPC matrix may be divided into five parts. A, B, C, D, and E shown in FIG. 1 represent the five parts of the Raptor-like LDPC matrix. The matrix A may be referred to as a Raptor-like LDPC base graph and corresponds to an information bit part of a coded block. The matrix B includes at least one column whose column weight is 3, and there is a bi-diagonal structure on a right side of the column whose column weight is 3. The matrix C is an all-zero matrix. The matrix E is an identity diagonal matrix. A form of the matrix D is not limited.

Figure 2:
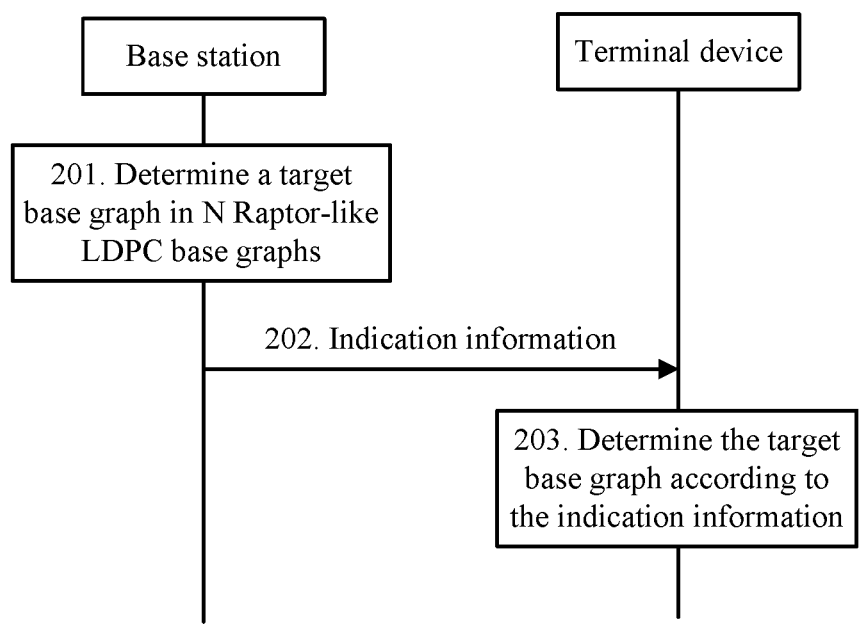
FIG. 2 is a schematic flowchart of a data transmission method according to an embodiment of this application.

FIG. 2 is a schematic flowchart of a data transmission method according to an embodiment of this application.

201. A base station determines a target base graph in N Raptor-like LDPC base graphs, where N is a positive integer greater than or equal to 2. A first base graph and a second base graph are any two of the N Raptor-like LDPC base graphs. A quantity of columns corresponding to information bits included in the first base graph is different from a quantity of columns corresponding to information bits included in the second base graph. An intersection between code lengths supported by the first base graph and the second base graph is not empty, and an intersection between code rates supported by the first base graph and the second base graph is not empty.

The base station may determine the target base graph based on a current service requirement, for example, whether a latency or performance is preferentially considered. For example, in a selection implementation in which performance is preferentially considered, optimal decoding performance during initial transmission may be preferentially ensured. In this case, the base station prerecords matrices, in matrices prestored by a encoder, achieving optimal performance and corresponding to different input code lengths and different initial transmission code rates. The base station may select an optimal Raptor-like LDPC base graph as the target base graph based on an actual code length and an actual code rate. In another matrix selection implementation in which a latency is preferentially considered, the base station may select a matrix based on a requirement of an actual service for a latency. When the service requires a relatively low latency, the base station may determine to use a Raptor-like LDPC base graph in which a quantity of columns corresponding to information bits is relatively small as the target base graph.

Certainly, the base station may alternatively determine the target base graph based on another selection condition. For example, the base station may alternatively determine the target base graph based on a current service type, such as enhanced mobile Internet (eMBB) and ultra-reliable and low latency communications (uRLLC).

Optionally, in some embodiments, the columns of the second base graph are a subset of the columns of the first base graph.

More specifically, in some embodiments, it is assumed that the first base graph includes K columns. The second base graph may include K' columns, where K' is a positive integer smaller than K. The first column to the $k^{th}$ column in the K' columns are the first column to the $k^{th}$ column in the K columns, and the $(k+1)^{th}$ column to the $K'^{th}$ column in the K' columns are the $(K-(K'-k-1))^{th}$ column to the $K^{th}$ column in the K columns, where K, K', and k are all positive integers, K' is smaller than K, and k is smaller than K'.

Optionally, in some embodiments, k is a positive integer greater than 1. For example, the first base graph includes 32 columns, and the second base graph includes 16 columns. The $1^{st}$ column to the $10^{th}$ column in the second base graph may be the $1^{st}$ column to the $10^{th}$ column in the first base graph. The $11^{th}$ column to the $16^{th}$ column in the second base graph are the $27^{th}$ column to the $32^{nd}$ column in the first base graph.

Further, in some embodiments, k may be equal to K'-1. For example, the first base graph includes 32 columns, and the second base graph includes 16 columns. The $1^{st}$ column to the $15^{th}$ column in the second base graph may be the $1^{st}$ column to the $15^{th}$ column in the first base graph. The $16^{th}$ column in the second base graph is the $32^{nd}$ column in the first base graph.

202. The base station sends indication information to a terminal device, where the indication information is used to indicate the terminal device to use the target base graph to perform LDPC encoding and decoding.

203. The terminal device determines the target base graph according to the indication information.

Optionally, in some embodiments, the base station may determine, in at least N MCS indexes based on a correspondence between a modulation and coding scheme (MCS) index and a base graph, a target MCS index corresponding to the target base graph. The base station may send the target MCS index to the terminal device. The target MCS index is the indication information.

The correspondence between an MCS index and a base graph may be indicated by using an MCS table. The MCS table includes the at least N MCS indexes, and each of the at least N MCS indexes corresponds to one of the N Raptor-like LDPC base graphs. Each of the at least N MCS indexes further corresponds to at least one of a modulation order and a transport block size index.

Different target base graphs used to perform LDPC encoding usually support different code rate ranges and different code length ranges. For example, a larger Raptor-like LDPC base graph is usually suitable for supporting a longer code length and a higher code rate, and a smaller Raptor-like LDPC base graph is usually suitable for supporting only a shorter code length and a lower code rate. For a code length and a code rate that are supported by a matrix alone, when an MCS index is used to determine a transport block size and a modulation order that correspond to the MCS index, the code length and code rate are determined, to determine information about a target base graph. For a code length supported by a plurality of matrices and a code rate supported by a plurality of matrices, based on different selection policies, both a target base graph and a transport block size index corresponding to the target base graph may be indicated to the terminal device by using an MCS index.

After determining the target base graph, the base station may determine, based on the target base graph, an MCS index corresponding to the target base graph based on the target base graph. Specifically, the base station may receive channel environment information sent by the terminal device, for example, a channel quality indicator (CQI). The base station may determine a plurality of candidate MCS indexes based on the CQI. Modulation orders and transport block size indexes indicated by these candidate MCS indexes all correspond to the CQI. In addition, base graphs indicated by these candidate MCS indexes are different. The base station may determine, in the candidate MCS indexes based on the determined target base graph, the MCS index indicating the target base graph, and send the determined MCS index to the terminal device. The terminal device may determine, based on the correspondence between an MCS index and a base graph, the target base graph corresponding to the received target MCS index.

Table 1 is a schematic diagram of an MCS table.

TABLE 1

| MCS index | Modulation order | Base graph | Transport block size index |
|---|---|---|---|
| 0 | 2 | 1 | 0 |
| 1 | 2 | 2 | 0 |
| 2 | 2 | 1 | 1 |
| 3 | 2 | 2 | 1 |
| 4 | 4 | 1 | 2 |
| 5 | 4 | 2 | 2 |

A quantity of Raptor-like LDPC base graphs in the MCS table shown in Table 1 is 2. It is assumed that the base station may determine, based on the CQI reported by the terminal device, to use the MCS index 0 and the MCS index 1. This is because modulation orders and transport block sizes corresponding to the two MCS indexes satisfy the CQI. If the base station determines that the target base graph is the base graph 2, the base station may send the MCS index 1 to the terminal device. The terminal device may determine, based on the received MCS index, to use the base graph 2 as the target base graph.

Optionally, in some other embodiments, the base station may send control information to the terminal device, where the control information includes the indication information.

Optionally, in some embodiments, the control information may be downlink control information (DCI). The DCI may carry the indication information explicitly. For example, a field may be added to the DCI, and the field includes at least one bit. The field may be used to carry the indication information. The terminal device may determine the target base graph based on the field. The DCI may alternatively carry the indication information implicitly. For example, N fields respectively representing N Raptor-like LDPC base graphs may be defined. The base station may perform an XOR operation on a field corresponding to the target base graph and a specified field in the DCI. The terminal device may perform the XOR operation on the specified field and each of the N fields. Cyclic redundancy check on the DCI is likely to succeed only when the terminal device and the base station perform the XOR operation on same fields. The terminal device may determine a Raptor-like LDPC base graph corresponding to a field that enables successful cyclic redundancy check on the DCI, as the target LDPC base graph.

Optionally, in some embodiments, a code length of each to-be-encoded code block may correspond to an lifting factor. A wireless transmission device as a transmit end device may determine a target lifting factor based on a code length of a to-be-encoded code block, and perform LDPC encoding on the code length of the to-be-encoded code block based on the target base graph and the target lifting factor. A wireless transmission device as a receive end device may directly obtain the target lifting factor from the transmit end device. The receive end device may alternatively determine the target lifting factor based on the code length of the to-be-encoded code block, and perform LDPC decoding on received information based on the target lifting factor and the target base graph. The code length of the to-be-encoded code block may be sent from the transmit end to the receive end device or may be determined by the receive end device. A correspondence between the code length of the to-be-encoded code block and the lifting factor is stored in the wireless transmission device. In addition, it may be understood that, a correspondence between a code length of a to-be-encoded code block and an lifting factor stored in the base station is the same as a correspondence between a code length of a to-be-encoded code block and an lifting factor stored in the terminal device.

Optionally, in some other embodiments, a wireless transmission device as a transmit end device may determine a target lifting factor group in at least two lifting factor groups based on requirement information, each of the at least two lifting factor groups includes a plurality of lifting factors, and the requirement information includes at least one of a terminal device type, a throughput rate requirement, a latency requirement, an initial-transmission code rate value, and a service type. The transmit end device may determine, based on a code length of a to-be-encoded code block, a target lifting factor in a plurality of lifting factors included in the target lifting factor group. The transmit end device may perform LDPC encoding on the to-be-encoded code block based on the target lifting factor and the target base graph. Similarly, a wireless transmission device as a receive end device may alternatively determine a target lifting factor group in the at least two lifting factor groups based on requirement information; determine, based on the code length of the to-be-encoded code block, the target lifting factor in a plurality of lifting factors included in the target lifting factor group; and perform LDPC decoding on a received code block based on the target lifting factor and the target base graph. It may be understood that, a rule of determining the target lifting factor by the transmit end device is the same as a rule of determining the target lifting factor by the receive end device, so that the receive end device can perform decoding correctly. In addition, the transmit end device sends a length of a transport block to the receive end device. The receive end may determine the code length of the to-be-encoded code block according to a preset code block segmentation rule. The code block received by the receive end device is obtained by the transmit end device by performing LDPC encoding on the to-be-encoded code block based on the target lifting factor and the target base graph. The code block segmentation rule used by the receive end device is the same as a code block segmentation rule used by the transmit end device. Therefore, the code length that is determined by the receive end device and that is of the to-be-encoded code block is the same as a code length that is determined by the transmit end device and that is of the to-be-encoded code block.

Each of a plurality of lifting factors included in the at least two lifting factor groups may correspond to a code length of a to-be-encoded code block. A code length of one to-be-encoded code block may correspond to different lifting factors in different lifting factor groups. An lifting factor included in an lifting factor group is preset. The at least two lifting factor groups and a correspondence between the code length of the to-be-encoded code block and an lifting factor are stored in the wireless transmission device. It may be understood that, the base station and the terminal device store same lifting factor groups and a same correspondence between a code length of a to-be-encoded code block and an lifting factor.

A setting of lifting factor groups may correspond to the requirement information. It is assumed that there are two lifting factor groups. A first group of lifting factors in the two lifting factor groups is applicable to encoding during which there is a relatively high latency requirement, and a second group of lifting factors is applicable to encoding during which there is a general latency requirement. In this case, if the transmit end device determines that there is a relatively high latency requirement during encoding, the first group of lifting factors may be determined as the target lifting factor group. Similarly, the lifting factor groups may be divided based on different service types, terminal device types, throughput rate requirements, initial-transmission code rates, and the like. Certainly, different lifting factor groups may alternatively correspond to different requirement information. For example, a group of lifting factors is applicable to encoding during which there is a relatively high latency requirement, and another group of lifting factors is applicable to encoding during which there is a relatively high throughput rate requirement.

An initial-transmission code rate, also referred to as a first-time transmission code rate and the like, is a transmission code rate for sending, after rate matching is performed on a code block having undergone LDPC encoding, the encoded code block to the receive end device for the first time.

Based on the foregoing technical solution, the base station may determine a target base graph in a plurality of Raptor-like LDPC base graphs that may be used to perform LDPC encoding, and indicate the target base graph to the terminal device. Further, for one code rate or one code length, the base station may select different base graphs as required. In addition, the plurality of Raptor-like LDPC base graphs may also support different code rates and different code lengths. This can increase a range of supported code rates and code lengths.

Figure 3:
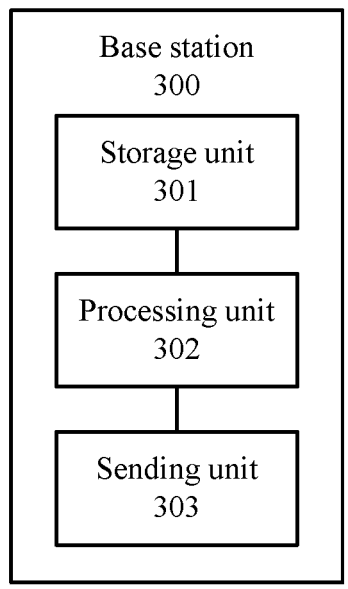
FIG. 3 is a structural block diagram of a base station according to an embodiment of this application.

FIG. 3 is a structural block diagram of a base station according to an embodiment of this application. As shown in FIG. 3, the base station 300 includes a storage unit 301, a processing unit 302, and a sending unit 303.

The storage unit 301 is configured to store N Raptor-like LDPC base graphs.

The processing unit 302 is configured to determine a target base graph in the N Raptor-like LDPC base graphs stored in the storage unit 301, a first base graph and a second base graph are any two of the N Raptor-like LDPC base graphs, a quantity of columns corresponding to information bits included in the first base graph is different from a quantity of columns corresponding to information bits included in the second base graph, an intersection between code lengths supported by the first base graph and the second base graph is not empty, an intersection between code rates supported by the first base graph and the second base graph is not empty, and N is a positive integer greater than or equal to 2.

The sending unit 303 is configured to send indication information to a terminal device, where the indication information is used to indicate the terminal device to use the target base graph to perform LDPC encoding and decoding.

The base station 300 shown in FIG. 3 may determine a target base graph in a plurality of Raptor-like LDPC base graphs that may be used to perform LDPC encoding and decoding, and indicate the target base graph to the terminal device. Further, for one code rate or one code length, the base station 300 may select different base graphs as required.

The storage unit 301 may be implemented by a memory, the processing unit 302 may be implemented by a processor, and the sending unit 303 may be implemented by a transmitter.

In addition, the base station 300 may further include a receiving unit, and the receiving unit may be configured to receive a code block sent by the terminal device. The receiving unit may be implemented by a receiver.

For a specific function and a beneficial effect of each unit of the base station 300, refer to the method shown in FIG. 2, and details are not described herein again.

Figure 4:
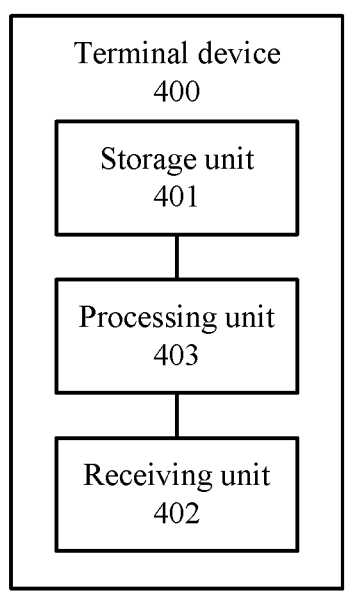
FIG. 4 is a structural block diagram of a terminal device according to an embodiment of this application.

FIG. 4 is a structural block diagram of a terminal device according to an embodiment of this application. The terminal device 400 shown in FIG. 4 includes a storage unit 401, a receiving unit 402, and a processing unit 403.

The storage unit 401 is configured to store N Raptor-like LDPC base graphs.

The receiving unit 402 is configured to receive indication information sent by a base station.

The processing unit 403 is configured to determine, according to the indication information, a target base graph used to perform LDPC encoding and decoding, where the target base graph is from the N Raptor-like LDPC base graphs stored in the storage unit 401, a first base graph and a second base graph are any two of the N Raptor-like LDPC base graphs, a quantity of columns corresponding to information bits included in the first base graph is different from a quantity of columns corresponding to information bits included in the second base graph, an intersection between code lengths supported by the first base graph and the second base graph is not empty, an intersection between code rates supported by the first base graph and the second base graph is not empty, and N is a positive integer greater than or equal to 2.

The storage unit 401 may be implemented by a memory, the receiving unit 402 may be implemented by a receiver, and the processing unit 403 may be implemented by a processor.

For a specific function and a beneficial effect of each unit of the terminal device 400, refer to the method shown in FIG. 2, and details are not described herein again.

Figure 5:
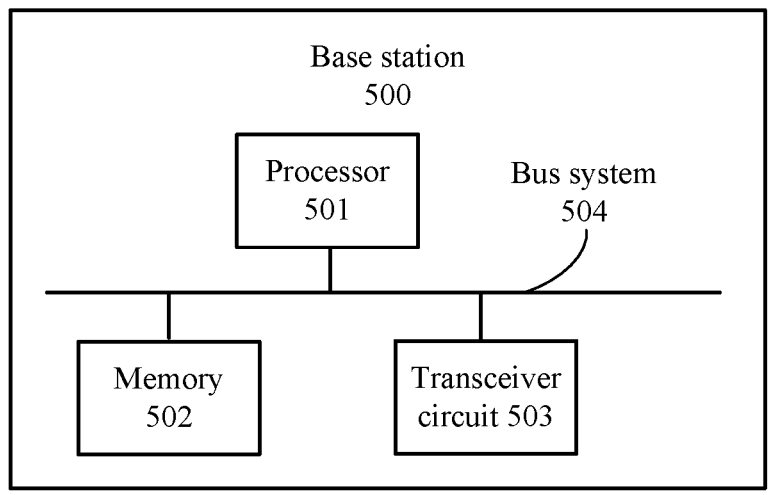
FIG. 5 is a structural block diagram of a base station according to an embodiment of this application.

FIG. 5 is a structural block diagram of a base station according to an embodiment of this application. The base station 500 shown in FIG. 5 includes a processor 501, a memory 502, and a transceiver circuit 503.

The components of the base station 500 are coupled together by using a bus system 504. In addition to a data bus, the bus system 504 includes a power bus, a control bus, and a status signal bus. However, for clarity of description, various buses are denoted as the bus system 504 in FIG. 5.

The method disclosed in the foregoing embodiment of this application may be applied to the processor 501, or may be implemented by the processor 501. The processor 501 may be an integrated circuit chip and has a signal processing capability. In an implementation process, the steps in the foregoing method can be implemented by using a hardware integrated logical circuit in the processor 501, or by using an instruction in a form of software. The foregoing processor 501 may be a general purpose processor, a digital signal processor (DSP), an application-specific integrated circuit (ASIC), a field programmable gate array (FPGA) or another programmable logic device, a discrete gate or transistor logic device, or a discrete hardware component. The processor 501 may implement or perform the methods, the steps, and logical block diagrams that are disclosed in the embodiments of this application. The general purpose processor may be a microprocessor, or the processor may be any conventional processor or the like. Steps of the methods disclosed in the embodiments of this application may be directly performed and accomplished by a hardware decoding processor, or may be performed and accomplished by a combination of a hardware module and a software module in the decoding processor. A software module may be located in a mature storage medium in the art, such as a random access memory (RAM), a flash memory, a read-only memory (ROM), a programmable read-only memory, an electrically erasable programmable memory, or a register. The storage medium is located in the memory 502. The processor 501 reads an instruction in the memory 502 and completes the steps in the foregoing method in combination with the transceiver circuit 503.

Figure 6:
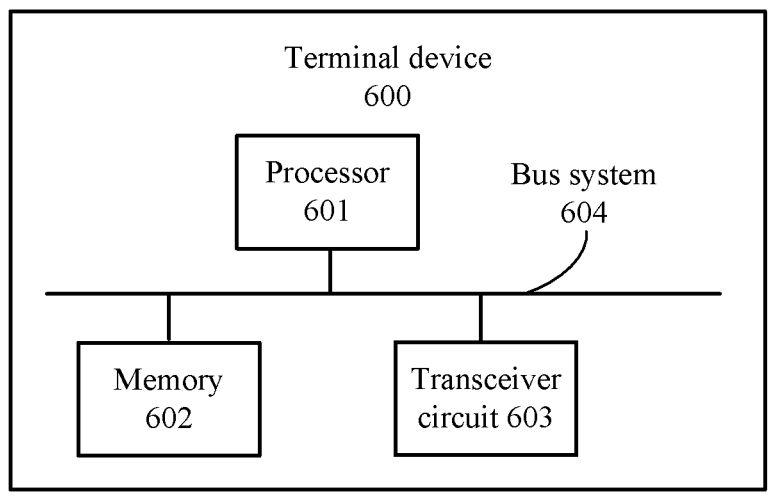
FIG. 6 is a structural block diagram of a terminal device according to an embodiment of this application.

FIG. 6 is a structural block diagram of a terminal device according to an embodiment of this application. The terminal device 600 shown in FIG. 6 includes a processor 601, a memory 602, and a transceiver circuit 603.

The components of the terminal device 600 are coupled together by using a bus system 604. In addition to a data bus, the bus system 604 includes a power bus, a control bus, and a status signal bus. However, for clarity of description, various buses are denoted as the bus system 604 in FIG. 6.

The method disclosed in the foregoing embodiment of this application may be applied to the processor 601, or may be implemented by the processor 601. The processor 601 may be an integrated circuit chip and has a signal processing capability. In an implementation process, steps in the foregoing method can be implemented by using a hardware integrated logical circuit in the processor 601, or by using an instruction in a form of software. The foregoing processor 601 may be a general purpose processor, a digital signal processor (DSP), an application-specific integrated circuit (ASIC), a field programmable gate array (FPGA) or another programmable logic device, a discrete gate or transistor logic device, or a discrete hardware component. The processor 601 may implement or perform the methods, the steps, and logical block diagrams that are disclosed in the embodiments of this application. The general purpose processor may be a microprocessor, or the processor may be any conventional processor or the like. Steps of the methods disclosed in the embodiments of this application may be directly performed and accomplished by a hardware decoding processor, or may be performed and accomplished by a combination of a hardware module and a software module in the decoding processor. A software module may be located in a mature storage medium in the art, such as a random access memory (RAM), a flash memory, a read-only memory (ROM), a programmable read-only memory, an electrically erasable programmable memory, or a register. The storage medium is located in the memory 602. The processor 601 reads an instruction in the memory 602 and completes the steps in the foregoing method in combination with the transceiver circuit 603.

A person of ordinary skill in the art may be aware that, units and algorithm steps in the examples described in the embodiments disclosed in this application may be implemented by electronic hardware or a combination of computer software and electronic hardware. Whether the functions are performed by hardware or software depends on a particular application and a designed constraint of the technical solutions. A person skilled in the art may use different methods to implement the described functions for each particular application, but it should not be considered that the implementation goes beyond the scope of this application.

It may be clearly understood by a person skilled in the art that, for the purpose of convenient and brief description, for a detailed working process of the foregoing system, apparatus, and unit, reference may be made to a corresponding process in the foregoing embodiments of method, and details are not described herein again.

In the several embodiments provided in this application, it should be understood that the disclosed system, apparatus, and method may be implemented in other manners. For example, the described apparatus embodiment is merely an example. For example, a division of units is merely a division based on a logical function, there may be other ways of division in actual implementation. For example, a plurality of units or components may be combined or integrated into another system, or some features may be ignored or not be performed. In addition, the displayed or discussed mutual couplings or direct couplings or communication connections may be implemented through some interfaces. The indirect couplings or communication connections between the apparatuses or units may be implemented in electrical, mechanical, or other forms.

The units described as separate parts may or may not be physically separate, and parts displayed as units may or may not be physical units, that is, they may be located in one position, or may be distributed on a plurality of network units. Some or all of the units may be selected based on actual requirements to achieve the objectives of the solutions of the embodiments.

In addition, functional units in the embodiments of this application may be integrated into one processing unit, or each of the units may exist alone physically, or two or more units are integrated into one unit.

All or some of the foregoing embodiments may be implemented by using software, hardware, firmware, or any combination thereof. When software is used to implement the embodiments, the embodiments may be implemented completely or partially in a form of a computer program product. The computer program product includes one or more computer instructions. When the computer program instruction is loaded and executed on the computer, the procedure or the functions according to the embodiments of this application are all or partially generated. The computer may be a general-purpose computer, a special-purpose computer, a computer network, or another programmable apparatus. The computer instruction may be stored in a computer-readable storage medium or may be transmitted from a computer-readable storage medium to another computer-readable storage medium. For example, the computer instruction may be transmitted from a website, a computer, a server, or a data center to another website, another computer, another server, or another data center in a wired (for example, a coaxial cable, an optical fiber, or a digital subscriber line (DSL)) or wireless (for example, infrared, radio, and microwave, or the like) manner. The computer-readable storage medium may be any usable medium accessible by a computer, or a data storage device, such as a server integrating one or more usable mediums, or a data center. The usable medium may be a magnetic medium (for example, a floppy disk, a hard disk, or a magnetic tape), an optical medium (for example, a DVD), or a semiconductor medium (for example, a solid state disk (SSD)), or the like.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A method for data transmission, the method comprising:
   receiving, by a terminal device, indication information from a base station; and
   determining, by the terminal device according to the indication information, a target base graph used to perform low-density parity-check (LDPC) encoding and decoding, wherein the target base graph is from N Raptor-like LDPC base graphs, a first base graph and a second base graph are any two of the N Raptor-like LDPC base graphs, a quantity of columns corresponding to information bits comprised in the first base graph is different from a quantity of columns corresponding to information bits comprised in the second base graph, an intersection between code lengths supported by the first base graph and code lengths supported by the second base graph is not empty, an intersection between code rates supported by the first base graph and code rates supported by the second base graph is not empty, and N is a positive integer greater than or equal to 2.

2. The method according to claim 1, wherein the indication information is a modulation and coding scheme (MCS) index.

3. The method according to claim 2, wherein the determining, by the terminal device according to the indication information, the target base graph comprises:
   determining, by the terminal device based on a correspondence between an MCS index and a base graph, a base graph corresponding to the MCS index as the target base graph.

4. The method according to claim 3, wherein the correspondence between the MCS index and the base graph is indicated by an MCS table, wherein the MCS table comprises at least N MCS indexes, each of the at least N MCS indexes corresponds to one of the N Raptor-like LDPC base graphs, and each of the at least N MCS indexes further corresponds to at least one of a modulation order and a transport block size index.

5. The method according to claim 2, wherein the determining, by the terminal device according to the indication information, the target base graph comprises:
   determining, by the terminal device, a transport block size and a modulation order according to the MCS index;
   determining, by the terminal device, a code length and a code rate according to the transport block size and the modulation order; and
   determining, by the terminal device, the target base graph according to the code length and the code rate.

6. The method according to claim 1, further comprising:
  determining, by the terminal device based on a code length of a to-be-encoded code block, a target lifting factor; and
  performing, by the terminal device, LDPC encoding on the to-be-encoded code block based on the target lifting factor and the target base graph.

7. The method according to claim 1, further comprising:
  determining, by the terminal device based on a code length of a to-be-encoded code block, a target lifting factor; and
  performing, by the terminal device, LDPC decoding on received information based on the target lifting factor and the target base graph.

8. The method according to claim 1, wherein the indication information is included in a control information.

9. The method according to claim 8, wherein the control information is downlink control information (DCI).

10. An apparatus, comprising:
  a processor; and
  a non-transitory computer-readable storage medium coupled to the processor and storing programming instructions for execution by the processor, the programming instructions instruct the processor to:
    receive indication information from a base station; and
    determine, according to the indication information, a target base graph used to perform low-density parity-check (LDPC) encoding and decoding, wherein the target base graph is from N Raptor-like LDPC base graphs stored in the storage unit, a first base graph and a second base graph are any two of the N Raptor-like LDPC base graphs, a quantity of columns corresponding to information bits comprised in the first base graph is different from a quantity of columns corresponding to information bits comprised in the second base graph, an intersection between code lengths supported by the first base graph and code lengths supported by the second base graph is not empty, an intersection between code rates supported by the first base graph and code rates supported by the second base graph is not empty, and N is a positive integer greater than or equal to 2.

11. The apparatus according to claim 10, wherein the indication information is a modulation and coding scheme (MCS) index.

12. The apparatus according to claim 11, wherein the programming instructions instruct the processor to:
  determine, based on a correspondence between an MCS index and a base graph, a base graph corresponding to the target MCS index as the target base graph.

13. The apparatus according to claim 12, wherein the correspondence between an MCS index and a base graph is indicated by an MCS table, wherein the MCS table comprises at least N MCS indexes, each of the at least N MCS indexes corresponds to one of the N Raptor-like LDPC base graphs, and each of the at least N MCS indexes further corresponds to at least one of a modulation order and a transport block size index.

14. The apparatus according to claim 11, wherein the programming instructions instruct the processor to:
  determine a transport block size and a modulation order according to the MCS index;
  determine a code length and a code rate according to the transport block size and the modulation order; and
  determine the target base graph according to the code length and the code rate.

15. The apparatus according to claim 10, wherein the programming instructions instruct the processor to:
  determine, based on a code length of a to-be-encoded code block, a target lifting factor in a plurality of lifting factors comprised in the target lifting factor group; and
  perform LDPC encoding on the to-be-encoded code block based on the target lifting factor and the target base graph.

16. The apparatus according to claim 10, wherein the programming instructions instruct the processor to:
  determine, based on a code length of a to-be-encoded code block, a target lifting factor in a plurality of lifting factors comprised in the target lifting factor group; and
  perform LDPC decoding on received information based on the target lifting factor and the target base graph.

17. The apparatus according to claim 10, wherein the indication information is included in a control information.

18. The apparatus according to claim 17, wherein the control information is downlink control information (DCI).

19. A non-transitory computer readable medium comprising computer program codes stored thereon, wherein the program codes are executable by one or more digital processors to cause a computing device to perform steps of:
  receiving indication information from a base station; and
  determining according to the indication information, a target base graph used to perform low-density parity-check (LDPC) encoding and decoding, wherein the target base graph is from N Raptor-like LDPC base graphs, a first base graph and a second base graph are any two of the N Raptor-like LDPC base graphs, a quantity of columns corresponding to information bits comprised in the first base graph is different from a quantity of columns corresponding to information bits comprised in the second base graph, an intersection between code lengths supported by the first base graph and code lengths supported by the second base graph is not empty, an intersection between code rates supported by the first base graph and code rates supported by the second base graph is not empty, and N is a positive integer greater than or equal to 2.

20. The non-transitory computer readable medium according to claim 19, wherein the indication information is a modulation and coding scheme (MCS) index.

21. The non-transitory computer readable medium according to claim 20, wherein determining the target base graph comprises:
  determining, based on a correspondence between an MCS index and a base graph, a base graph corresponding to the MCS index as the target base graph.

22. The non-transitory computer readable medium according to claim 21, wherein the correspondence between an MCS index and a base graph is indicated by an MCS table, wherein the MCS table comprises at least N MCS indexes, each of the at least N MCS indexes corresponds to one of the N Raptor-like LDPC base graphs, and each of the at least N MCS indexes further corresponds to at least one of a modulation order and a transport block size index.

23. The non-transitory computer readable medium according to claim 20, wherein determining the target base graph comprises:
  determining a transport block size and a modulation order according to the MCS index;
  determining a code length and a code rate according to the transport block size and the modulation order; and
  determining the target base graph according to the code length and the code rate.

24. The non-transitory computer readable medium according to claim 19, wherein the program codes executable by one or more digital processors further cause the computing device to perform steps of:
  determining, based on a code length of a to-be-encoded code block, a target lifting factor; and
  performing LDPC encoding on the to-be-encoded code block based on the target lifting factor and the target base graph.

25. The non-transitory computer readable medium according to claim 19, wherein the program codes executable by one or more digital processors further cause the computing device to perform steps of:
  determining, based on a code length of a to-be-encoded code block, a target lifting factor; and
  performing LDPC decoding on received information based on the target lifting factor and the target base graph.

26. The non-transitory computer readable medium according to claim 19, wherein the indication information is included in a control information.

27. The non-transitory computer readable medium according to claim 26, wherein the control information is downlink control information (DCI).

* * * * *